United States Patent
Shimazawa et al.

(10) Patent No.: US 7,535,682 B2
(45) Date of Patent: May 19, 2009

(54) MAGNETO-RESISTANCE ELEMENT AND THIN FILM MAGNETIC HEAD WITH IMPROVED HEAT RELIABILITY

(75) Inventors: Koji Shimazawa, Tokyo (JP); Yoshihiro Tsuchiya, Tokyo (JP); Tomohito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 483 days.

(21) Appl. No.: 11/519,854

(22) Filed: Sep. 13, 2006

(65) Prior Publication Data

US 2007/0058301 A1 Mar. 15, 2007

(30) Foreign Application Priority Data

Sep. 14, 2005 (JP) .............................. 2005-266968

(51) Int. Cl.
*G11B 5/39* (2006.01)
(52) U.S. Cl. .................................................. 360/324.1
(58) Field of Classification Search ............... 360/324.1, 360/324.11, 324.12, 324.2, 322; 428/811.5
See application file for complete search history.

(56) References Cited

U.S. PATENT DOCUMENTS

| | | | |
|---|---|---|---|
| 6,084,752 A | 7/2000 | Sakakima et al. | |
| 6,947,263 B2 * | 9/2005 | Saito | 360/324.12 |
| 7,336,453 B2 * | 2/2008 | Hasegawa et al. | 360/324.12 |
| 7,381,480 B2 * | 6/2008 | Nakamura et al. | 428/811.5 |
| 7,420,786 B2 * | 9/2008 | Sugiyama et al. | 360/322 |
| 2003/0137785 A1 | 7/2003 | Saito | |
| 2005/0280958 A1 * | 12/2005 | Saito et al. | 360/324.12 |
| 2006/0050445 A1 * | 3/2006 | Kim et al. | 360/324.2 |
| 2006/0050446 A1 * | 3/2006 | Ishizone et al. | 360/324.12 |

FOREIGN PATENT DOCUMENTS

| | | |
|---|---|---|
| JP | 09-288807 A | 11/1997 |
| JP | 2003-218428 A | 7/2003 |
| JP | 2004-221526 A | 8/2004 |
| WO | WO 2004/055906 | 7/2004 |

OTHER PUBLICATIONS

Magnetic Material Handbook, Asakura Publishing Co., Ltd.
K. Nagasaka et al., "Giant magnetoresistance properties of spin valve films in current-perpendicular-to-plane geometry," vol. 25, No. 4-2, pp. 807-810, 2001.

(Continued)

*Primary Examiner*—Tianjie Chen
(74) *Attorney, Agent, or Firm*—Oliff & Berridge, PLC

(57) ABSTRACT

A magneto-resistance element according to the present invention has a pinned layer whose magnetization direction is fixed; a free layer whose magnetization direction varies in accordance with an external magnetic field; and a nonmagnetic spacer layer that is arranged between the pinned layer and the free layer, at least the pinned layer or the free layer includes a layer having Heusler alloy represented by composition formula $X_2YZ$ (where X is a precious metal element, Y is a transition metal of Mn, V, or Ti group, Z is an element from group III to group V), and a part of composition X is replaced with Co, and an atomic composition ratio of Co in composition X is from 0.5 to 0.85.

11 Claims, 15 Drawing Sheets

OTHER PUBLICATIONS

M. Sahashi et al., "High MR Performance of Spin-Valve Films in CPP Geometry," vol. 26, No. 9, pp. 979-984, 2002.

J.A. Caballero et al., "Effect of deposition parameters on the CPP-GMR of NiMnSb-based spin-valve structures," Journal of Magnetism and Magnetic Materials, vols. 198-199, 1999, abstract.

M.P. Raphael et al., "Magnetic, structural, and transport properties of thin film and single crystal $Co_2MnSi$," Applied Physics Letters, vol. 79, No. 26, pp. 4396-4398, 2001.

I. Galanakis et al., "Slater-Pauling behavior and origin of the half-metallicity of the full-Heusler alloys," Physical Review B, 66, 174429, 2002.

* cited by examiner

| | upper electrode | 132 |
| | second ferromagnetic layer | 130 |
| | nonmagnetic interlayer | 128 |
| | first ferromagnetic layer | 126 |
| | antiferromagnetic layer | 124 |
| | lower electrode | 122 |

| $m^{spin}(\mu_B)$ | Ru, Rh | Mn | Z | Total |
|---|---|---|---|---|
| $Ru_2MnSi$ | 0.028 | 2.868 | 0.025 | 2.948 |
| $Rh_2MnGe$ | 0.002 | 2.952 | 0.021 | 2.977 |
| $Ru_2MnSn$ | −0.051 | 3.137 | −0.001 | 3.034 |
| $Ru_2MnSb$ | 0.222 | 3.495 | 0.018 | 3.957 |
| $Rh_2MnAl$ | 0.328 | 3.388 | −0.041 | 4.004 |
| $Rh_2MnGa$ | 0.312 | 3.461 | −0.033 | 4.052 |
| $Rh_2MnIn$ | 0.269 | 3.720 | −0.034 | 4.223 |
| $Rh_2MnTl$ | 0.266 | 3.765 | −0.027 | 4.270 |
| $Rh_2MnGe$ | 0.421 | 3.672 | 0.011 | 4.525 |
| $Rh_2MnSn$ | 0.393 | 3.831 | −0.010 | 4.607 |
| $Rh_2MnPb$ | 0.383 | 3.888 | −0.009 | 4.644 |

102 thin film magnetic conversion element 101 thin film magnetic conversion element assembly

MAGNETO-RESISTANCE ELEMENT AND THIN FILM MAGNETIC HEAD WITH IMPROVED HEAT RELIABILITY

This Application is a U.S. Non-Provisional Patent Application that claims the foreign priority benefit from Japanese Application No. 2005-266968, filed Sep. 14, 2005, the complete disclosure of which is incorporated herein by reference.

BACKGROUND OF THE INVENTION

1. Field of the Invention

The present invention relates to a thin film magnetic head for a hard disk drive and a magneto-resistance element used as a reproducing unit in the thin film magnetic head.

2. Description of the Related Art

As hard disk drivers become ever-denser, performance improvement in thin film magnetic heads is required. As a thin film magnetic head, there is widely used a complex thin film magnetic head made by laminating a reproducing head that has a magneto-resistance element (MR element) for reading and a recording head that has an inductive electromagnetic conversion element for writing. Currently, a magneto-resistance element that is operated by feeding a current in parallel with a film surface, which is called a spin-valve-type Giant Magnetoresistance (GMR) element, is widely used.

In the spin valve GMR element, an insulation layer, called a gap layer, is arranged between the upper and lower shield layers made of soft magnetic metal films. The recording density in the bit direction is determined by a gap (a reproduction gap interval) between the upper and lower shield layers.

As the recoding density becomes higher, there is a strong requirement that the shield gap and the track be narrowed. The element area is reduced by the narrowed tracks and the element height that is attendant thereon is shortened, however, in the conventional arrangement, because the heat radiation efficiency is lowered as the area is reduced, the reliability of operating current is restricted. To solve these problems, Japanese Patent Laid-Open No. 09-288807 (hereinafter, called Document 1) discloses a head structure in which the first shield film, the second shield film, and the magneto-resistance element are electrically connected in series and no insulation layer is arranged between the shield films. Such a structure is called a Current Perpendicular to the Plane (CPP) structure, and is an essential technique to attain a recoding density over 200 Gbits/in2. A brief explanation is given of a so-called "spin valve type" CPP-GMR element below.

The CPP-GMR element has a laminated structure that is formed on a suitable material having two layers of ferromagnetic films that are separated by a conductive nonmagnetic interlayer.

FIG. 1 is a cross-sectional view showing one structure example of a CPP-GMR element. As shown in FIG. 1, the representative laminated structure of the spin-valve-type CPP-GMR element includes lower electrode 122, antiferromagnetic film 124, first ferromagnetic film 126, nonmagnetic interlayer 128, second ferromagnetic film 130, and upper electrode 132. In FIG. 1, the uppermost layer is upper electrode 132 and the lowermost layer is lower electrode 122, and the upper electrode and the lower electrode are omitted in the laminated structure, which will be described later.

The magnetization direction of second ferromagnetic film 130 is vertical to the magnetization direction of first ferromagnetic film 126 when the externally-applied magnetic field is zero. The magnetization direction of first ferromagnetic film 126 is fixed by making antiferromagnetic film 124 adjacent thereto and by applying unidirectional anisotropy energy (also called "exchange bias" or "coupling magnetic field") to first ferromagnetic film 126 by exchange coupling between antiferromagnetic film 124 and first ferromagnetic film 126. Therefore, first ferromagnetic film 126 is called a fixed (pinned) layer, and is hereinafter called the fixed layer or the pinned layer. On the other hand, a structure in which shield films and a magneto-resistance element are connected through metal, has the advantage that the heat radiation efficiency is improved and the operating current becomes large. Also, in this element, the resistance value becomes larger as the cross-sectional area of the element becomes smaller, and the resistance change amount is increased. In other words, this element is advantageously suitable for narrowing the track width.

A practical CPP-GMR element is disclosed in Journal of The Magnetics Society of Japan, vol. 25, pp. 807 to 810 (2001) (hereinafter, called Document 2). Document 2 discloses a so-called spin-valve-type CPP-GMR element, in which at least, a PdPtMn antiferromagnetic film, a fixed layer made of a CoFeB film of which the magnetization direction is fixed by this antiferromagnetic film, a Cu nonmagnetic interlayer, a free layer made of a CoFeB film of which the magnetization direction is freely changed in accordance with the external magnetic field, and an upper electrode are sequentially laminated on a lower electrode. Document 2 describes that a magnetic resistance change rate (hereinafter, called a MR ratio or a MR change rate) of the CPP-GMR element is about 1.16% (see Table 2 in Document 2) in the single spin valve structure. This MR change rate is insufficient in terms of output when practical use is considered. On the other hand, in the dual spin valve structure that can obtain a relatively high MR change rate, since each film thickness of both the two spin valves is large, that the film thickness of the spin valve is large does not meet the requirement that the lead gap be narrow.

As one technique of improving the MR change rate of the CPP-GMR element, Journal of The magnetics Society of Japan, Vol. 26, pp. 979 to 984 (2002) (hereinafter, called Document 3) discloses a current-narrowed-type CPP-GMR structure. This technique controls the flow of the sense current to optimize the effect of spin-dependent scattering according to the material of the spin valve. Document 3 describes that the MR ratio has become to about 3% in the single-spin-valve structure. However, this MR change rate is not yet sufficient in terms of output when practical use is considered.

It is considered that hindrance to improvement in the MR change rate of the CPP-GMR element is caused by low spin polarizability of the material that mainly includes Fe and Co, which is used for the first ferromagnetic film and the second ferromagnetic film. As one technique for obtaining a high-output (high MR ratio) CPP-GMR element, half-metal having spin polarizability P of 1 is used as a ferromagnetic film (a ferromagnetic film for the fixed layer or the free layer). The lager is the spin polarizability P, the lager is the MR ratio. The reason (mechanism) that the resistance change amount ($\Delta R$) is large when polarizability P is large, can be considered as follows. When polarizability P is large, one of up-spin and down-spin has a high state density near Fermi energy (namely, the number of conductive electrons is large), whereas the other has a low state density near Fermi energy (namely, the number of conductive electrons is small). Therefore, there is a large difference between a mean free path of up-spin conductive electrons and that of down-spin conductive electrons, and the MR change rate is large. Incidentally, spin polarizability P of the metal ferromagnetic film for the free layer and the fixed layer, which is applied to the conventional CPP-GMR, is small, about 0.3 to 0.5 that is extremely small in comparison with the spin polarizability P of half-metal, which is 1.

The Journal of Magnetism and Magnetic Materials Vol. 198 and 199, pp 55 to 57 (1999) (hereinafter, called Document 4) discloses a technique of a CPP-GMR using one kind of half-metal, called Huesler alloy. The MR change rate is not so large, about 8% at 4.2K, however, it is meaningful since Document 4 suggests that Huesler alloy is available to the CPP-GMR element.

Now, a brief explanation is given of Huesler alloy. Huesler alloy is a general term of intermetallic compounds having a chemical composition of XYZ or $X_2YZ$. The former is called half-Huesler and the latter is called full-Huesler. In this description, X is a transition metal element of the Co, Ni, or Cu group or precious metal in the periodic table. Y is a transition metal of the Mn, V or Ti group. Z is a typical element from group III to group V. Huesler alloy is named after F. Heusler who found that $Cu_2MnAl$ alloy, which does not include any ferromagnetic element, shows ferromagnetism. It is considered that the ferromagnetism that can be produced by magnetic moments are regularly arranged, i.e., by RKKY interaction. Applied Physics Letters Vol 79, Number 26, pp 4396 to 4398 (2001) (hereinafter, called Document 5) experimentally validates that $Co_2MnSi$, which is full-Heusler alloy, has a highly-saturated magnetization of about $5\mu_B$ and discusses that a high spin polarizability P and a high MR change rate, when used for the magneto-resistance element, are expected.

Japanese Patent Laid-Open No. 2003-218428 (hereinafter, called Document 6) discloses that $X_2YZ$, in particular, $Co_2MnZ$ (Z=Al, Si, Ga, Ge, Sn) is used for the CPP-GMR element.

Japanese Patent Laid-Open No. 2004-221526 (hereinafter, called Document 7) discloses that $Co_2(Fe_xCr_{1-x})Al$ is used for the TMR element or for the CPP-GMR element.

Physical Review B66, 174429 (2002) (hereinafter, called Document 8) discloses the calculated values of the spin moment in Heusler alloy, such as RuMnZ and RhMnZ, in table IV. The calculated values are shown in FIG. 2.

When X disclosed in Document 8 is used as the CPP-GMR element since a high spin moment can be obtained by full-Heusler alloy formed of precious metal, such as Ru, Rh, Ir, Pd, Pt, a high MR change rate caused by the high bulk diffusion effect can be expected. On the other hand, as described in Magnetic Material Handbook (ISBN4-254-13004-X), Asakura Publishing Co., Ltd., p374, there is a problem that the full-Heusler alloy formed of precious metal, such as Ru, Rh, Ir, Pd, Pt, generally has a low Curie temperature and is unsuitable for application to heads.

SUMMARY OF THE INVENTION

It is an object of the present invention to provide a magneto-resistance element and a thin film magnetic head with a high magnetic resistance change rate and with improved heat reliability.

A magneto-resistance element according to the present invention comprises a pinned layer whose magnetization direction is fixed, a free layer whose magnetization direction varies in accordance with an external magnetic field and a nonmagnetic spacer layer that is arranged between the pinned layer and the free layer, wherein at least the pinned layer or the free layer includes a layer having Heusler alloy represented by composition formula $X_2YZ$ (where X is a precious metal element, Y is a transition metal of Mn, V, or Ti group, Z is an element from group III to group V), a part of the composition X is replaced with Co, and an atomic composition ratio of Co in said composition X is from 0.5 to 0.85.

According to the present invention, the atomic composition ratio of Co in composition X of full-Heusler alloy that represented by a composition formula of $X_2YZ$ is 0.5 or more and 0.85 or less, and this full-Heusler alloy is included in at least the free layer and the pinned layer, whereby the magnetic resistance change rate is higher than the conventional art at the practical temperature of the magneto-resistance element. The high bulk diffusion and the high Curie temperature can be attained simultaneously, and the MR change rate becomes high, heat radiation efficiency is improved and high heat-reliability can be obtained.

The above and other objects, features and advantages of the present invention will become apparent from the following description with reference to the accompanying drawings which illustrate examples of the present invention.

DETAILED DESCRIPTION OF THE PREFERRED EMBODIMENTS

Embodiment 1

A magnetron-resistance element according to the present embodiment has a full-Heusler alloy represented by a composition formula of $X_2YZ$ (X is a precious metal including Cu, Y is a transition metal of Mn, V, or Ti group, and Z is any element from group III to group V) as a magnetic film. Hereinafter, the magneto-resistance element is explained in the case of a CPP-GMR element. Also, in the present embodiment, $(Co_xPd_{1-x})_2MnSn$ is used as a Heusler alloy thin film material. In $(Co_xPd_{1-x})_2MnSn$, composition X is Pd, a part of composition X is replaced with Co, composition Y is Mn, and composition Z is Sn.

Figures 1, 2:
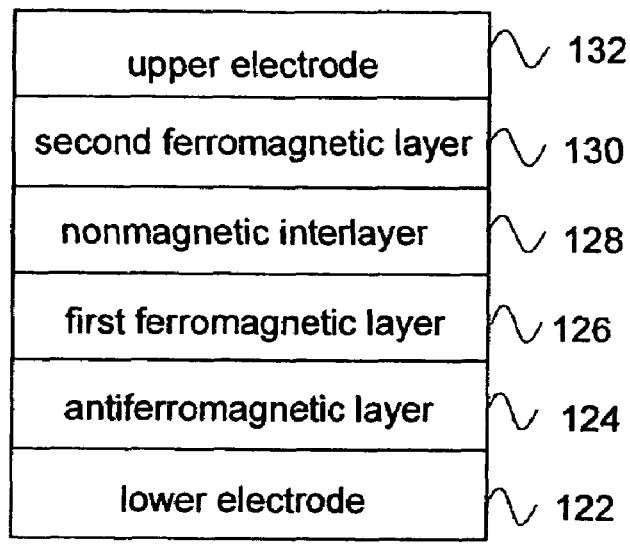
FIG. 1 is a cross-sectional view showing one structure example of a conventional CPP-GMR element.
FIG. 2 is a table showing spin magnetic moment in various full-Heusler alloys.
Figure 3:
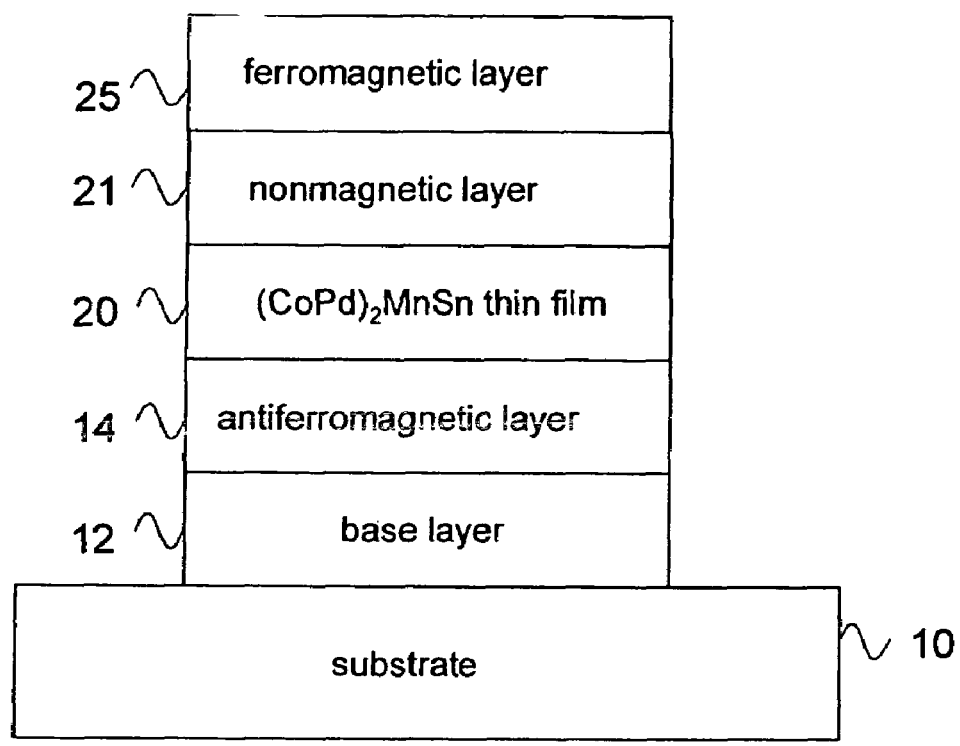
FIG. 3 is a cross-sectional view showing one structure example of a magneto-resistance element according to the present embodiment.

FIG. 3 is a cross-sectional view showing a structure example of a magneto-resistance element according to the present embodiment. As shown in FIG. 3, a CPP-GMR element is formed by sequentially laminating base layer 12, antiferromagnetic film 14, $(Co_xPd_{1-x})_2MnSn$ thin film 20, nonmagnetic layer 21, and ferromagnetic layer 25 on substrate 10. In this structure, antiferromagnetic layer 14 is used to fix the spin of $(Co_xPd_{1-x})_2MnSn$ thin film 20 for the so-called spin-valve-type structure. In this structure, $(Co_xPd_{1-x})_2MnSn$ thin film 20 is a pinned layer, ferromagnetic layer 25 is a free layer, and nonmagnetic layer 21 is a spacer layer arranged between two layers. Also, ferromagnetic layer 25 may be a single-layer structure or a multi-layer structure.

Metal, such as Cu, Cr, Ag, and Au, may be used as nonmagnetic layer 21, CoFe, NiFe, or a complex film of CoFe and NiFe may be used as ferromagnetic layer 25, and IrMn or the like may be used as antiferromagnetic layer 14. Also, as a buffer layer, Al, Cu, Cr, Fe, Nb, Hf, Ni, Ta, Ru, NiFe, NiCr, or a multi-layer film formed by these materials, like a Ta/Ru two-layer film, may be used. Further, a nonmagnetic electrode layer which will become a protection film, not shown, is preferably deposited on the free layer of the CPP-GMR element.

Figure 4:
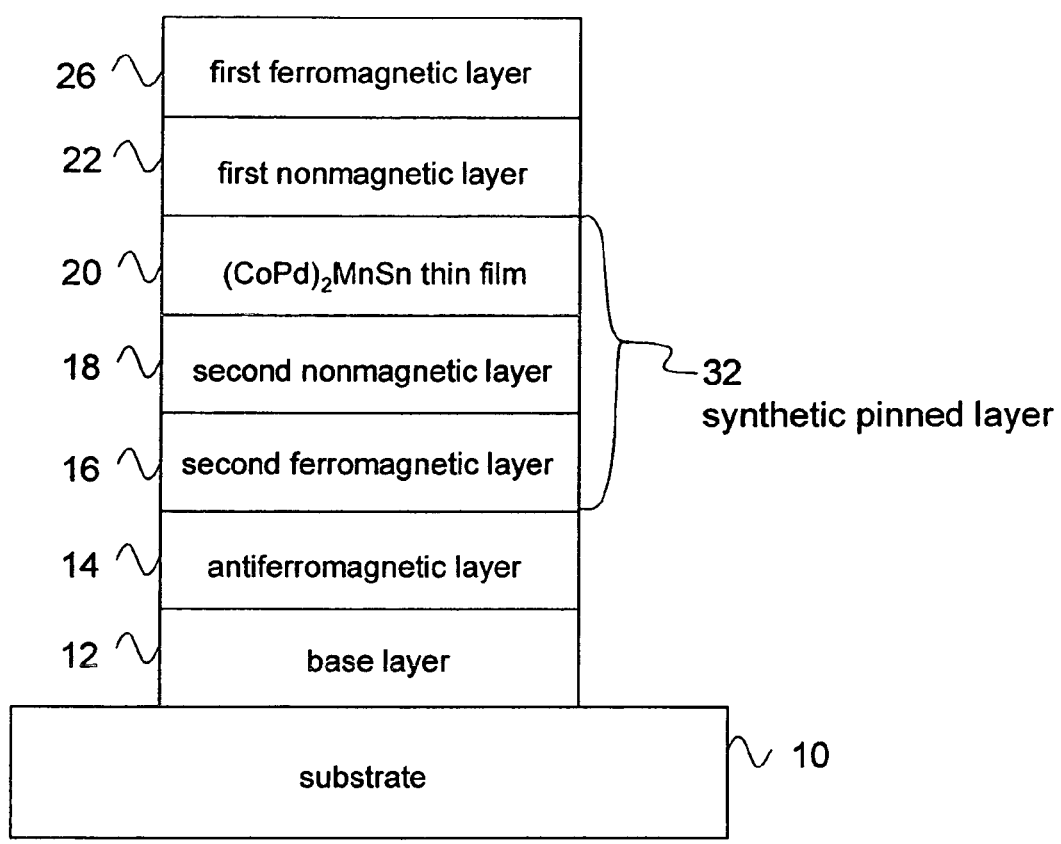
FIG. 4 is a cross-sectional view showing another structure example of a magneto-resistance element according to the present embodiment.

FIG. 4 is a cross-sectional view showing another structure example of a magneto-resistance element according to the present embodiment.

As shown in FIG. 4, a CPP-GMR element is formed by sequentially laminating base layer 12, antiferromagnetic layer 14, second ferromagnetic layer 16, second nonmagnetic layer 18, $(Co_xPd_{1-x})_2MnSn$ thin film 20, first nonmagnetic layer 22, and first ferromagnetic layer 26 on substrate 10. The structure of FIG. 4 is different from that of FIG. 3 in that magnetic films forming a pinned layer provide a synthetic structure. Second ferromagnetic layer 16, second nonmagnetic layer 18, and $(Co_xPd_{1-x})_2MnSn$ thin film 20 form synthetic pinned layer 32. In this structure, the magnetization directions of second ferromagnetic layer 16 and $(Co_xPd_{1-x})_2MnSn$ thin film 20 are opposite to each other. For second nonmagnetic layer 18, a material, such as Ru, Rh, Ir, and Cr, may be used. For first nonmagnetic layer 22, the same material as nonmagnetic layer 21 explained in FIG. 3 may be used. Also, for first ferromagnetic layer 26 and second ferromagnetic layer 16, the same material as ferromagnetic layer 25 explained in FIG. 3 may be used. The other arrangements are similar to those in FIG. 3.

Figure 5:
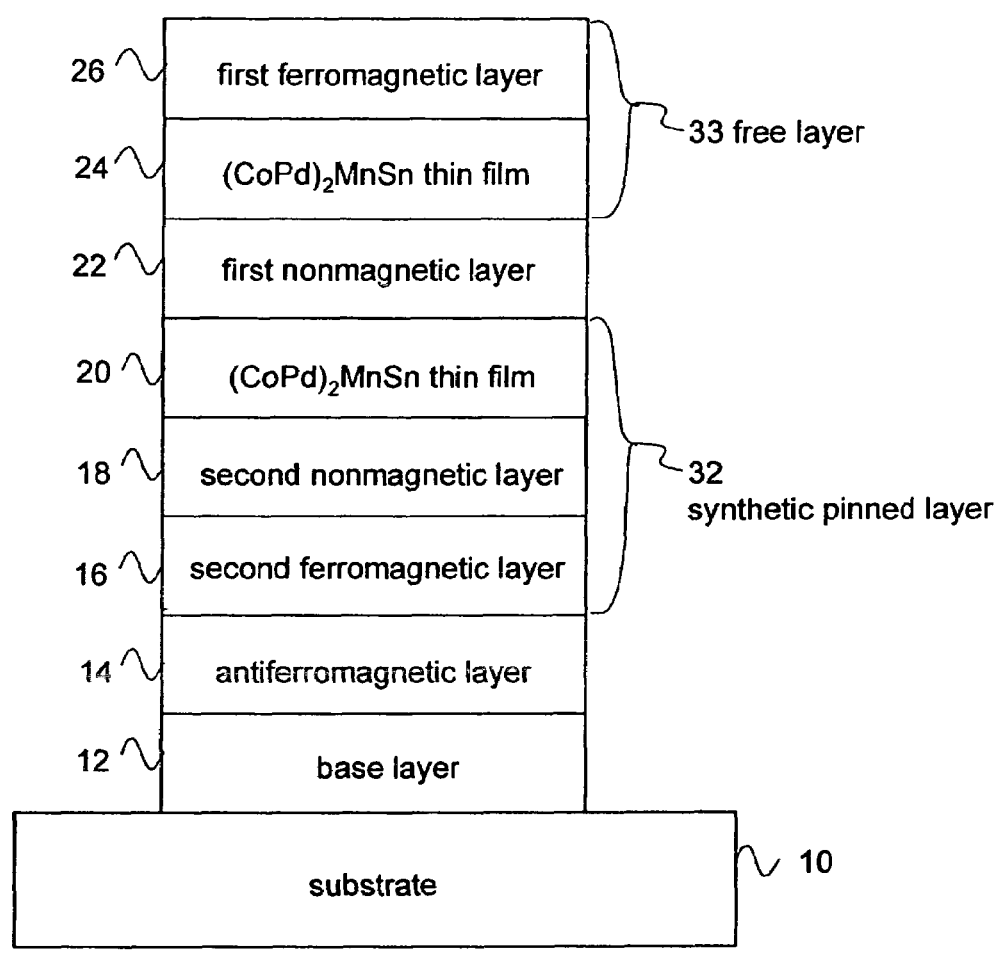
FIG. 5 is a cross-sectional view showing another structure example of a magneto-resistance element according to the present embodiment.

FIG. 5 is a cross-sectional view showing another structure example of a magneto-resistance element according to the present embodiment. As shown in FIG. 5, a CPP-GMR element is formed by sequentially laminating base layer 12, antiferromagnetic layer 14, second ferromagnetic layer 16, second nonmagnetic layer 18, $(Co_xPd_{1-x})_2MnSn$ thin film 20, first nonmagnetic layer 22, $(Co_xPd_{1-x})_2MnSn$ thin film 24, and first ferromagnetic layer 26 on substrate 10. The structure of FIG. 5 is different from that of FIG. 4 in that Heusler alloy thin films are used for both synthetic pinned layer 32 and free layer 33. $(Co_xPd_{1-x})_2MnSn$ thin film 24 and first ferromagnetic layer 26 form free layer 33.

Since Heusler alloy and nonmagnetic material are apt to mutually diffuse, a ferromagnetic layer, like CoFe and NiFe, is preferably inserted into the interface between the Heusler alloy and the nonmagnetic layer.

The film thickness of the $(Co_xPd_{1-x})_2MnSn$ thin film may be 1 nm or more and 100 nm or less. When the film thickness is below 1 nm, it is difficult to obtain one crystal structure of crystal structures L21, B2, A2, and when the film thickness exceeds 100 nm, unfavorably, it is difficult to apply the thin film to the CPP-GMR. The CPP-GMR element of the above structure according to the present invention can be manufactured by using the standard thin film forming method, such as the sputtering method, the deposition method, the laser ablation method, the MBE (Molecular Beam Epitaxy) method, and the mask step of forming an electrode in a predetermined shape.

It is difficult to experimentally demonstrate that the Heusler alloy thin film in the above arrangement is half metal, however, qualitatively, when a CPP-GMR element is manufactured and indicates an enormous MR change rate over 5%, the CPP-GMR element can be taken as half-metal. The reason is explained in comparison with the conventional art.

Figure 6A:
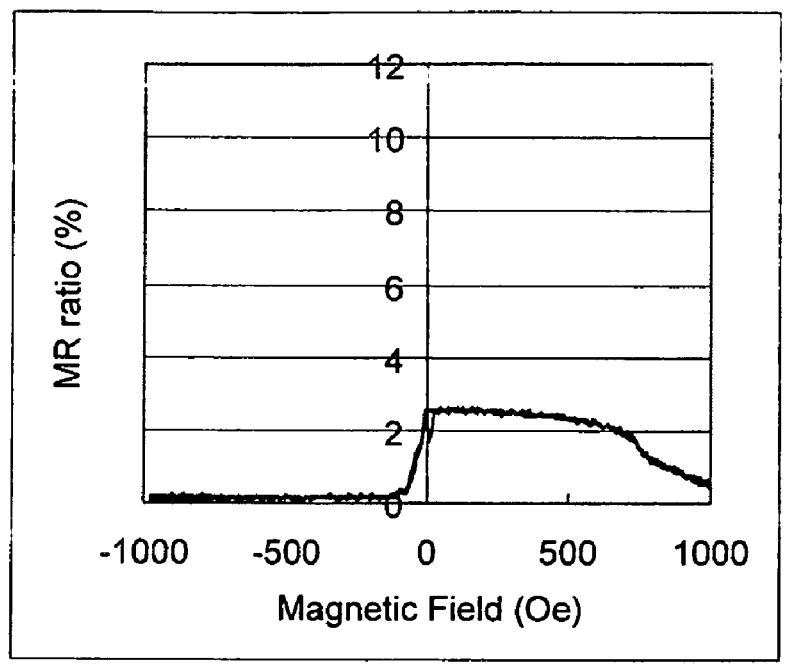
FIGS. 6A and 6B are graphs showing the MR change rate when magnetic field is varied.
Figure 6B:
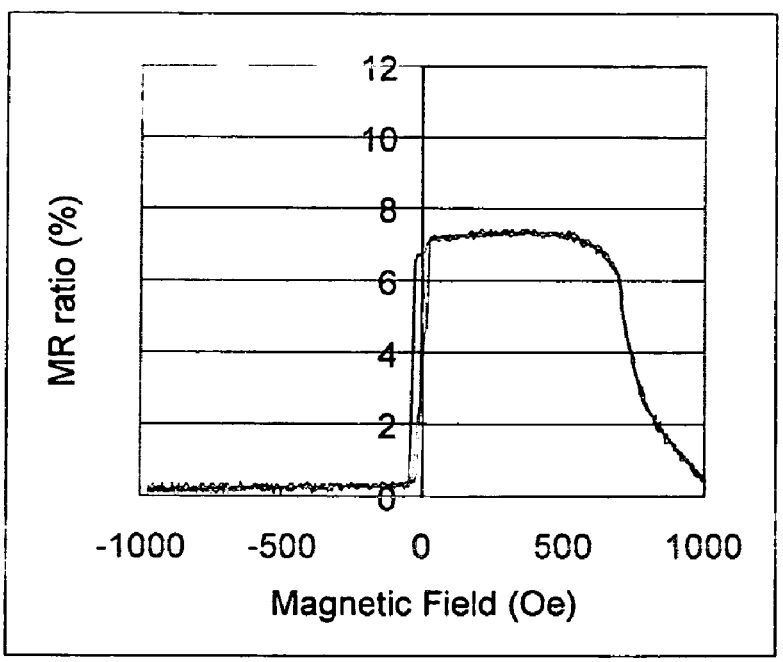

FIGS. 6A and 6B are graphs showing the MR change rate when the magnetic field is varied. FIG. 6A shows the conventional art, and FIG. 6B shows the present embodiment. As one ferromagnetic layer of the synthetic pinned layer, the laminated film of 90CoFe/30CoFe alloy is used in the conventional art, and the laminated film of $90CoFe/(Co_xPd_{1-x})_2MnSn$ is used in the present embodiment. Also, in both the conventional art and the present embodiment, 90CoFe alloy having a spin polarizability of 0.5 is used as the free layer. The MR change rate was measured when the magnetic field is varied from −1000 to +1000 Oe (1 Oe=(¼π)×10³ A/m) for the CPP-GMR element manufactured this way. As shown in FIG. 6A, the MR change rate in the conventional art is about 2.5%. On the other hand, the MR change rate according to the present embodiment is 7% or more.

As shown in the results in FIGS. 6A and 6B, in the CPP-GMR element in which the $(Co_xPd_{1-x})_2MnSn$ thin film according to the present invention is used as the ferromagnetic layer on one side of the nonmagnetic layer and in which 90CoFe alloy of spin polarizability of 0.5 is used on the other side of the nonmagnetic layer, a large MR change rate over 7% was obtained.

As the reason why such a large MR change rate can be obtained, the $(Co_xPd_{1-x})_2MnSn$ thin film has a large spin polarizability, and further, the structure including L21 or B2 structure can be obtained at room temperature to enhance the bulk scattering effect.

Figure 7:
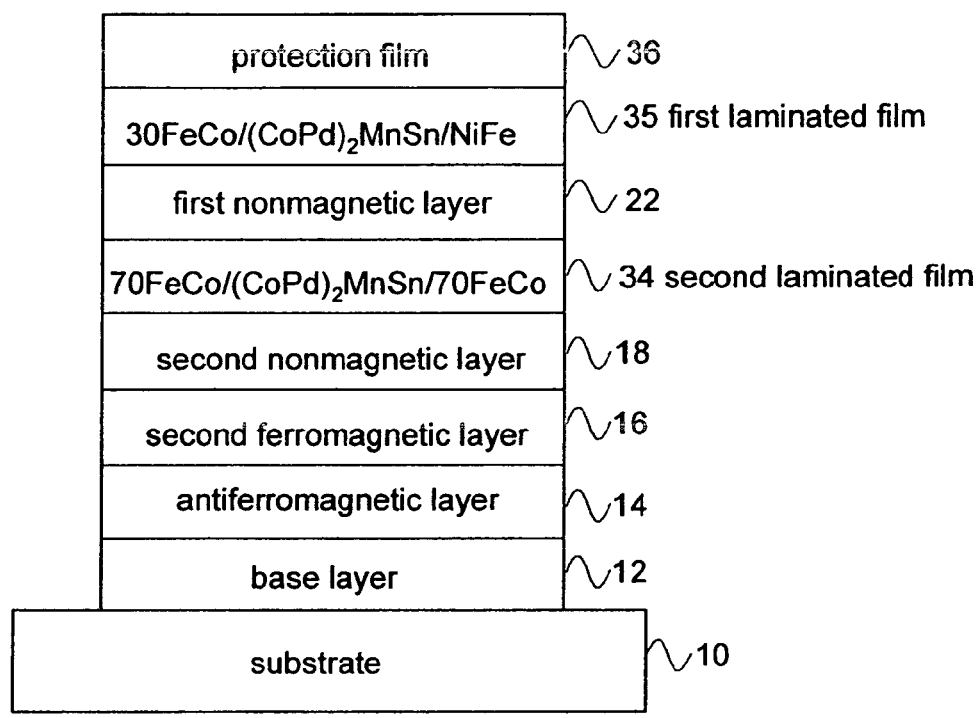
FIG. 7 is a cross-sectional view showing a structure of the magneto-resistance element according to the present embodiment.

Next, explanations are given of the structure of the magneto-resistance element shown in FIG. 5 according to the present embodiment. In this description, a spin valve GMR element is explained. FIG. 7 is a cross-sectional view showing a structure of a magneto-resistance element according to the present embodiment.

As shown in FIG. 7, a CPP-GMR element according to the present embodiment is formed by sequentially laminating Ta(1 nm)/ Ru(1 nm) which is base layer 12, IrMn (45 nm) which is antiferromagnetic layer 14, 30FeCo (3 nm) which is second ferromagnetic layer 16, Ru (0.7 nm) which is second nonmagnetic layer 18, second laminated film 34 having Heusler alloy, Cu (2 nm) which is first nonmagnetic layer 22, first laminated film 35 having Heusler alloy, and Ru (2 nm) which is protection film 36 on substrate 10. Second laminated film 34 is formed by sequentially laminating 70FeCo (1 nm), $(Co_xPd_{1-x})_2MnSn$ (3 nm), and 70FeCo (1 nm). First laminated film 35 is formed by sequentially laminating 30FeCo (1 nm), $(Co_xPd_{1-x})_2MnSn$ (2 nm), and NiFe (1.5 nm). A numeral between parentheses following the chemical formula indicates the film thickness. The Heusler alloy is put between ferromagnetic layers such as CoFe and NiFe, like first laminated film 34 and second laminated film 35, in order to prevent mutual diffusion between the Heusler alloy and the nonmagnetic material.

Second laminated film 34 corresponds to $(CoPd)_2MnSn$ thin film 20 shown in FIG. 5. Therefore, the laminated film that is formed by 30FeCo of second ferromagnetic layer 16, by Ru of second nonmagnetic layer 18, and by second laminated film 34, provides a ferromagnetic layer that functions as a pinned layer. IrMn of antiferromagnetic layer 14 functions to fix the spin in the ferromagnetic layer that will become a pinned layer. First laminated film 35 corresponds to free layer 33 shown in FIG. 5. Ta/Ru of base layer 12 is a buffer layer, and Cu of first nonmagnetic layer 22 is a nonmagnetic metal layer to provide the giant magneto-resistive effect.

Next, a brief explanation is given of the method of manufacturing the magneto-resistance element shown in FIG. 7.

At room temperature, by using a high-frequency sputtering apparatus, 2 nm of a NiFe plated film (not shown) that functions as a lower electrode is formed on an AlTiC substrate, each film of Ta(1 nm), Ru(1 nm), IrMn(45 nm), 30FeCo(3 nm), Ru(0.7 nm), 70FeCo(1 nm), $(Co_xPd_{1-x})_2MnSn$(3 nm), 70FeCo(1 nm), Cu(2 nm), 30FeCo(1 nm), $(Co_xPd_{1-x})_2MnSn$(2 nm), NiFe(1.5 nm), and Ru(2 nm) is deposited in order thereon to manufacture a multi-layer structure for a spin-valve-type CPP-GMR element. The magnetic field having 100 Oe is applied during film formation and uniaxial anisotropy is introduced. The microfabrication is performed on the manufactured multi-layer structure by using photolithography and an Ar ion milling apparatus to manufacture a CPP-GMR element of Φ0.2 μm.

Next, an experiment to show the influence of the composition of Co and Pd in $(Co_xPd_{1-x})_2MnSn$ on the MR change rate was made by using the CPP-GMR element shown in FIG. 7, and therefore the method is explained.

In $(Co_xPd_{1-x})_2MnSn$, x that determines the composition proportion of Co and Pd was varied from 0 to 1, and the Mn magnetic moment and the Curie temperature were obtained by calculation. Also, several kinds of spin valve GMR elements obtained by varying x from 0 to 1 in $(Co_xPd_{1-x})_2MnSn$ were prepared. Then, a voltage of 25 mV was applied between the upper and lower electrodes to cause the current to flow in the direction vertical to the film surface, an external magnetic field was applied, and the MR change rate was measured at room temperature. Also, in order to compare the experimental results, $Co_2MnSn$, in which x was set to 1 in $(Co_xPd_{1-x})_2MnSn$, was manufactured as a comparison example, in the structure shown in FIG. 7, and the MR change rate was measured in the same way as described above.

Next, the experimental results are explained.

Figure 8A:
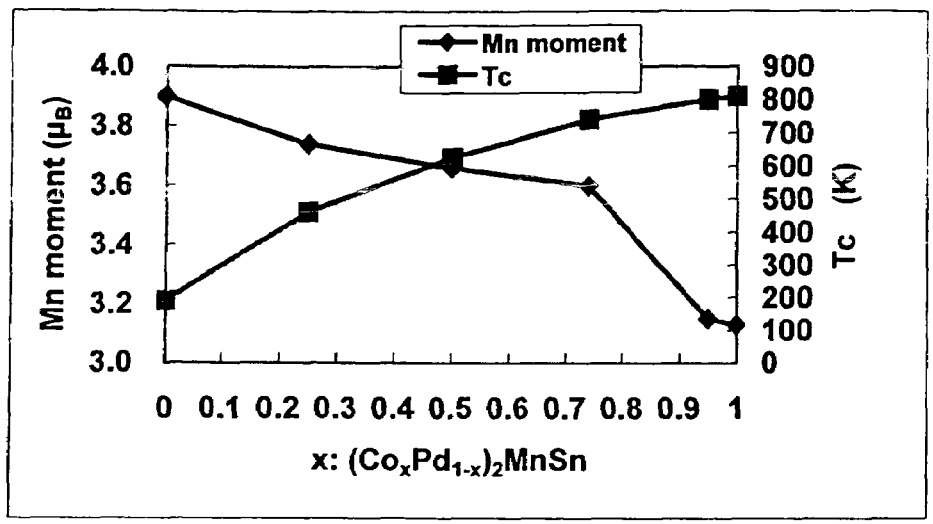
FIGS. 8A and 8B are graphs showing element characteristics when the composition of Co and Pd is varied in $(Co_xPd_{1-x})_2MnSn$.
Figure 8B:
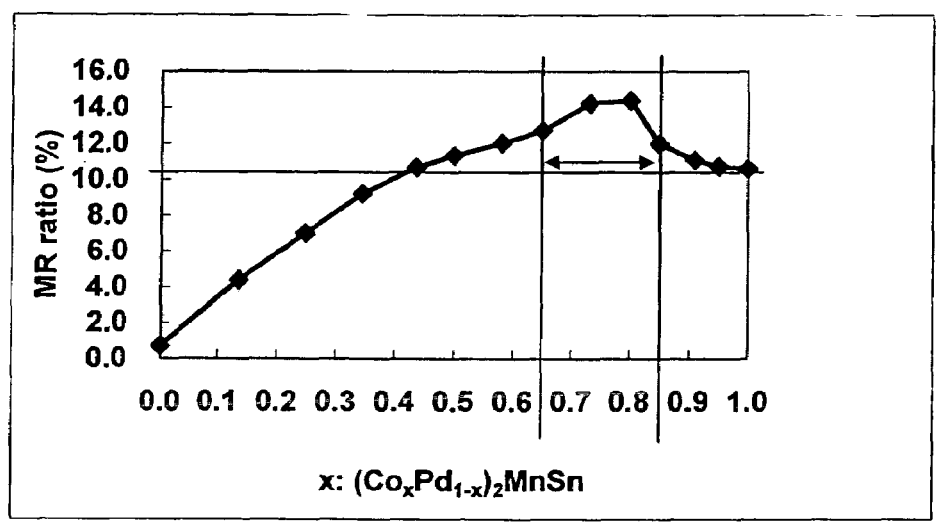

FIGS. 8A and 8B are graphs showing element characteristics when the composition of Co and Pd is varied in $(Co_xPd_{1-x})_2MnSn$. FIG. 8A is a graph showing changes of the Mn magnetic moment and the Curie temperature (Tc), and FIG. 8B is a graph showing the MR change rate at 300K. A straight line in FIG. 8B shows the MR change rate of 10.6% as the comparison example $(Co_2MnSn)$.

As shown in FIG. 8B, in the present embodiment, a MR change rate up to 14% is obtained. This value is larger than 10.6% that is the MR change rate of $Co_2MnSn$ as the comparison example. This responds to the increase in the magnetic moment of Mn when Pd is mixed with Cd, and responds to the increase in the magneto-resistance provided by the Mn site in $(Co_xPd_{1-x})_2MnSn$.

As shown in FIG. 8A, Pd enhances the magnetic moment of Mn in the entire composition areas, while the Curie temperature is lowered. It is suggested that a suitable composition range exists in order to obtain a Heusler alloy that can be practically used. As shown in FIG. 8B, in the range of $0.5 \leq x \leq 0.91$, a higher MR change rate than 10.6%, as the comparison example, $(Co_2MnSn)$ can be obtained. Also, there are inflection points near X=0.65, 0.85 in the graph, the inclinations around the inflection points vary sharply, and therefore the MR change rate becomes higher in the range of $0.65 \leq x \leq 0.85$. The reason why the MR change rate becomes higher is that, the rising of the Mn magnetic moment is steep, and when the ratio of Co is not over 60%, it is difficult for the bulk diffusion effect that causes the CPP-GMR to occur. Further, in the range of $0.65 \leq x \leq 0.85$, as shown in FIG. 8A, the high Curie temperature is obtained, the MR ratio can be effectively increased. Incidentally, the MR change rate of $Pb_2MnSn$ in the case of x=0 is 0.7%.

As for reasons why the GMR element of the CPP structure according to the present embodiment has enormous effects in comparison with the GMR element of the conventional spin-valve-type CPP structure, it was found that the spin polarizability rate of $(Co_xPd_{1-x})_2MnSn$ thin film is high and that the bulk diffusion effect is high because of the increase by the crystal structures of L21 and B2 in the Mn magnetic moment.

Next, since the magneto-resistance element in which Sn is replaced with Ge of the Heusler alloy was manufactured and since the above experiment was made on the manufactured magneto-resistance element, the result thereof is explained.

Figure 9A:
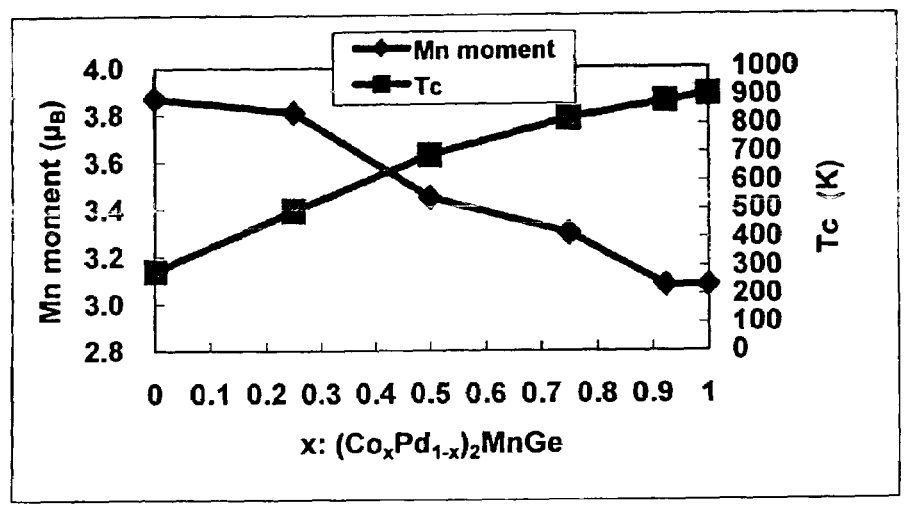
FIGS. 9A and 9B are graphs showing element characteristics when the composition of Co and Pd is varied in $(Co_xPd_{1-x})_2MnGe$.
Figure 9B:
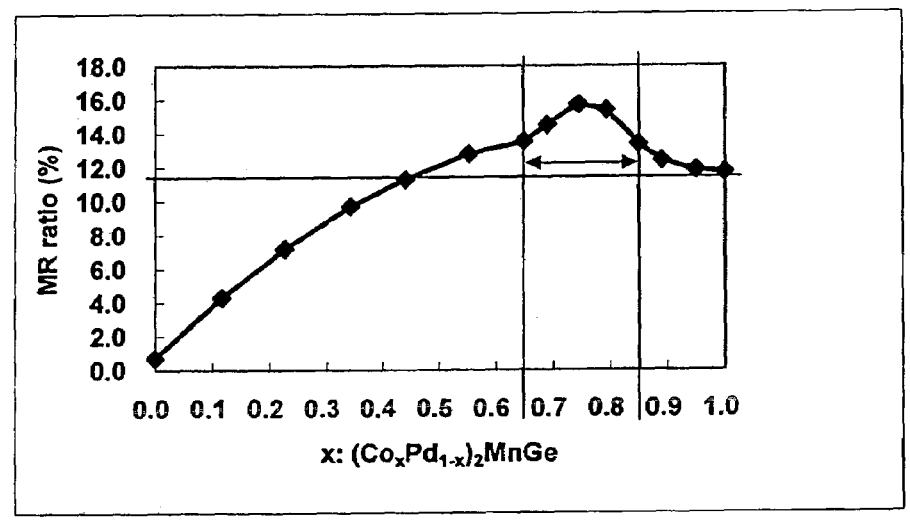

FIGS. 9A and 9B are graphs showing element characteristics when the composition of Co and Pd is varied in $(Co_xPd_{1-x})_2MnGe$. FIG. 9A is a graph showing changes of the Mn magnetic moment and the Curie temperature, and FIG. 9B is a graph showing the MR change rate at 300K. A straight line in FIG. 9B shows the MR change rate of 11.7% as the comparison example $(Co_2MnGe)$. Incidentally, the MR change rate of $Pb_2MnGe$ was 0.7%.

As shown in FIG. 8B, a higher MR change rate than the change rate of 11.7% in the comparison example $(Co_2MnGe)$ can be obtained in the range of $0.5 \leq x \leq 0.89$. Also, there are inflection points near X=0.65, 0.85 in the graph, the inclinations around the inflection points vary sharply, and therefore the MR change rate becomes higher in the range of $0.65 \leq x \leq 0.85$.

Next, since the magneto-resistance element in which Sn was replaced with Si of the Heusler alloy was manufactured and since the above experiment was made on the manufactured magneto-resistance element, the result thereof is explained.

Figure 10A:
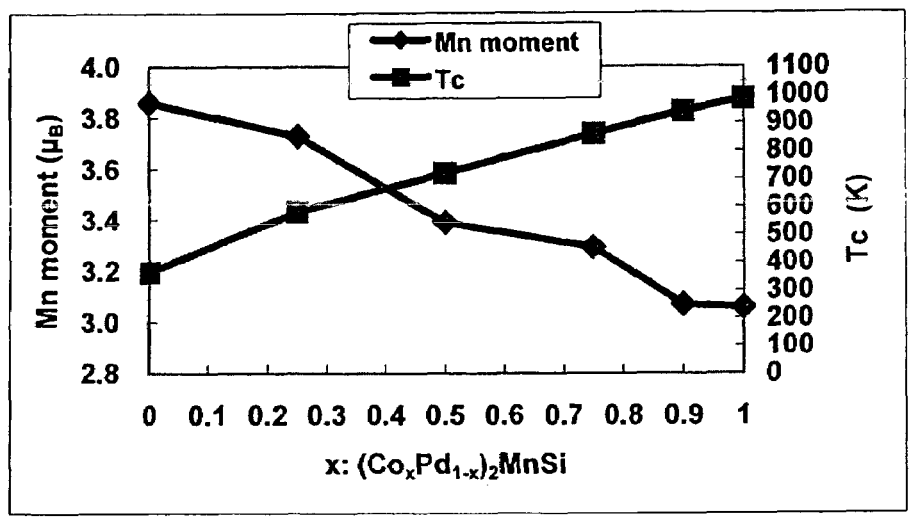
FIGS. 10A and 10B are graphs showing element characteristics when the composition of Co and Pd is varied in $(Co_xPd_{1-x})_2MnSi$.
Figure 10B:
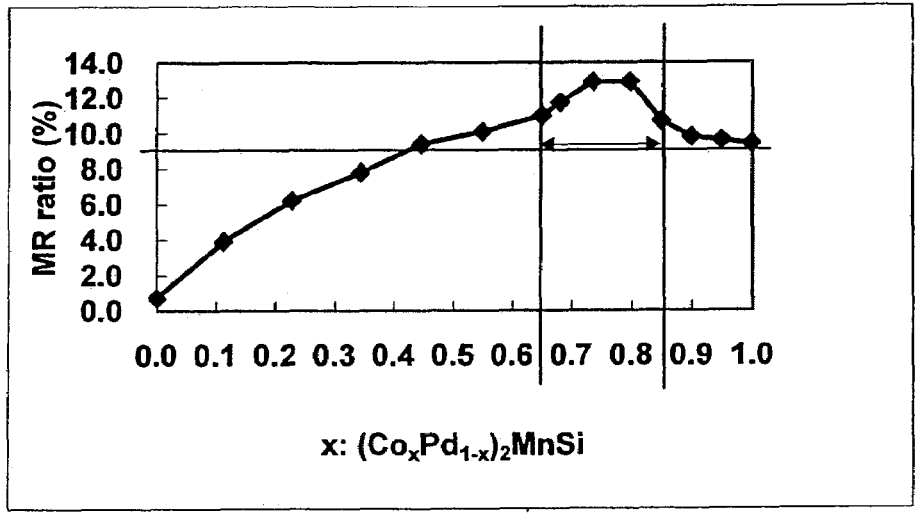

FIGS. 10A and 10B are graphs showing element characteristics when the composition of Co and Pd is varied in $(Co_xPd_{1-x})_2MnSi$. FIG. 10A is a graph showing changes of the Mn magnetic moment and the Curie temperature, and FIG. 10B is a graph showing the MR change rate at 300K. A straight line in FIG. 10B shows the MR change rate of 9.4% as the comparison example ($Co_2MnSi$). Incidentally, the MR change rate of $Pb_2MnSi$ was 0.7%.

As shown in FIG. 10B, a higher MR change rate than the change rate of 9.4% in the comparison example ($Co_2MnSi$) can be obtained in the range of $0.5 \leq x \leq 0.9$. Also, there are inflection points near X=0.65, 0.85 in the graph, the inclinations around the inflection points vary sharply, and therefore the MR change rate becomes higher the range of $0.65 \leq x \leq 0.85$.

As shown by the results in FIGS. 8A to 10B, $(Co_xPd_{1-x})_2MnZ$ can obtain a higher MR change rate than $Co_2MnZ$ and $Pd_2MnZ$ in the range of $0.5 \leq x \leq 0.89$ independently of the kind of Z element. Also, the MR change rate becomes still higher in the range of $0.65 \leq x \leq 0.85$.

Next, since the magneto-resistance element in which Pb is replaced with Rh of the Heusler alloy was manufactured and since the above experiment was made on the manufactured magneto-resistance element, the result thereof is explained.

Figure 11A:
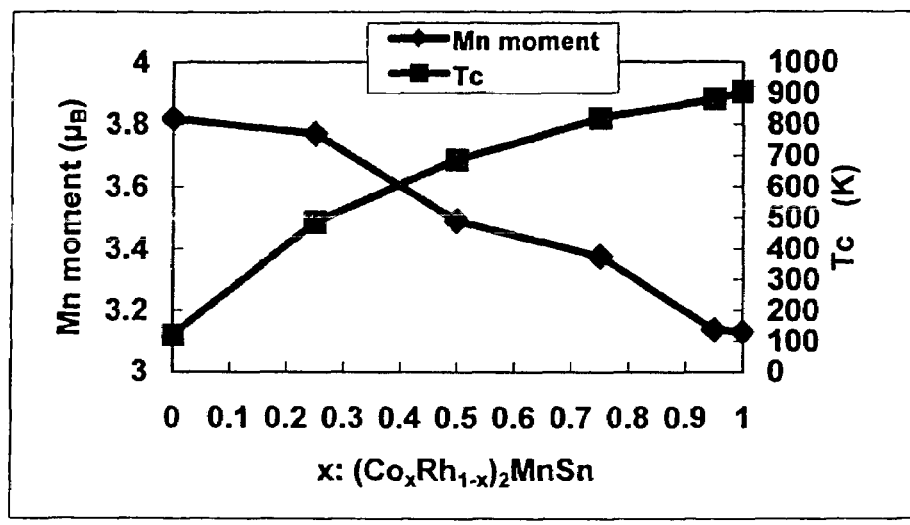
FIGS. 11A and 11B are graphs showing element characteristics when the composition of Co and Rh is varied in $(Co_xRh_{1-x})_2MnSn$.
Figure 11B:
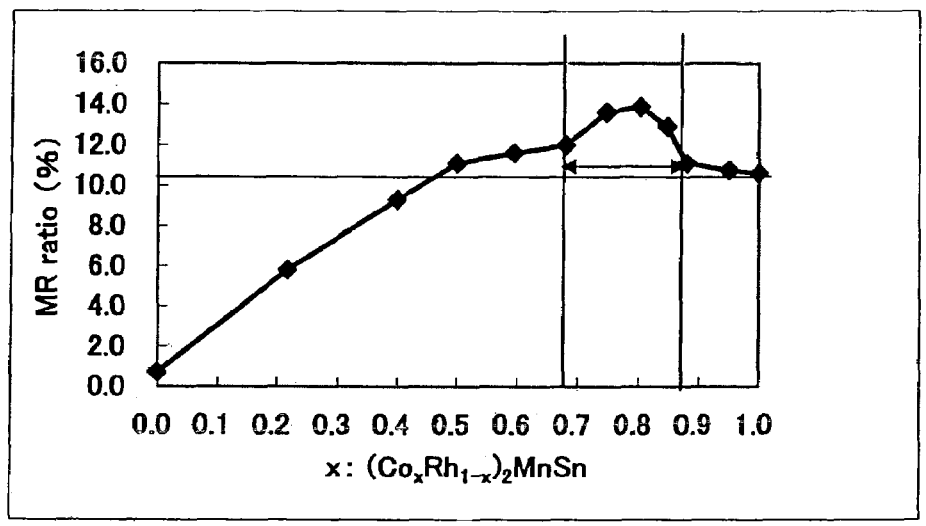

FIGS. 11A and 11B are graphs showing element characteristics when the composition of Co and Rh is varied in $(Co_xRh_{1-x})_2MnSn$. FIG. 11A is a graph showing changes of the Mn magnetic moment and the Curie temperature, and FIG. 11B is a graph showing the MR change rate at 300K. A straight line in FIG. 10B shows the MR change rate of 10.6% as the comparison example ($Co_2MnSn$). Incidentally, the MR change rate of $Rh_2MnSn$ was 0.7%.

As shown in FIG. 11B, a higher MR change rate than the change rate of 10.6% in the comparison example ($Co_2MnSn$) can be obtained in the range of $0.5 \leq x \leq 0.9$. Also, there are inflection points near X=0.65, 0.88 in the graph, the inclinations around the inflection points vary sharply, and therefore the MR change rate becomes still higher in the range of $0.65 \leq x \leq 0.88$.

As shown by the results in FIGS. 11A to 11B, $(Co_xRh_{1-x})_2MnSn$ can obtain a higher MR change rate than $Co_2MnSn$ and $Pd_2MnSn$ in the range of $0.5 \leq x \leq 0.9$. Referring to the results in FIGS. 8A to 10B, it is expected that $(Co_xRh_{1-x})_2MnZ$ can obtain a higher MR change rate than $Co_2MnZ$ and $Pd_2MnZ$ in the range of $0.5 \leq x \leq 0.9$ independently of the kind of Z element. Also, the MR change rate becomes still higher in the range of $0.68 \leq x \leq 0.88$.

Next, since the magneto-resistance element in which Pb was replaced with Ru of the Heusler alloy was manufactured and since the above experiment was made on the manufactured magneto-resistance element, the result thereof is explained.

Figure 12A:
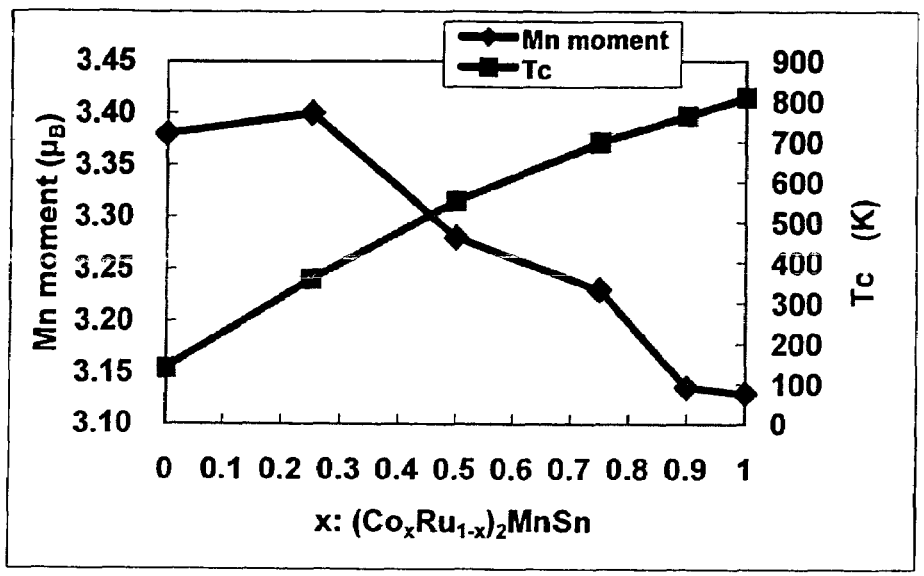
FIGS. 12A and 12B are graphs showing element characteristics when the composition of Co and Ru is varied in $(Co_xRu_{1-x})_2MnSn$.
Figure 12B:
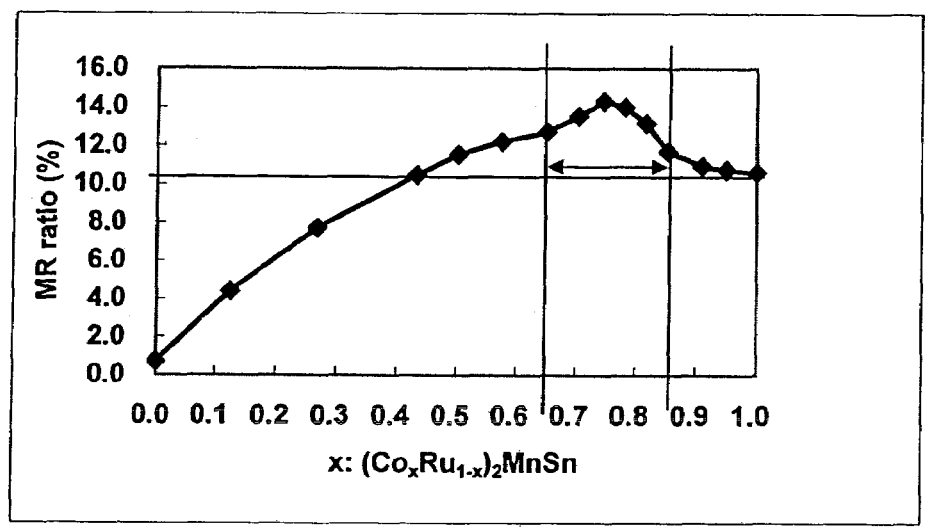

FIGS. 12A and 12B are graphs showing element characteristics when the composition of Co and Ru is varied in $(Co_xRu_{1-x})_2MnSn$. FIG. 12A is a graph showing changes of the Mn magnetic moment and the Curie temperature, and FIG. 12B is a graph showing the MR change rate at 300K. A straight line in FIG. 10B shows the MR change rate of 10.6% as the comparison example ($Co_2MnSn$). Incidentally, the MR change rate of $Ru_2MnSn$ was 0.7%.

As shown in FIG. 12B, a higher MR change rate than the change rate of 10.6% in the comparison example ($Co_2MnSn$) can be obtained in the range of $0.5 \leq x \leq 0.85$. Also, there are inflection points near X=0.65, 0.85 in the graph, the inclinations around the inflection points vary sharply, and therefore the MR change rate becomes higher in the range of $0.65 \leq x \leq 0.85$.

As shown by the results in FIGS. 12A to 12B, $(Co_xRu_{1-x})_2MnSn$ can obtain a higher MR change rate than $Co_2MnSn$ and $Pd_2MnSn$ in the range of $0.5 \leq x \leq 0.85$. Referring to the results in FIGS. 8A to 10B, it is expected that $(Co_xRu_{1-x})_2MnZ$ can obtain a higher MR change rate than $Co_2MnZ$ and $Ru_2MnZ$ in the range of $0.5 \leq x \leq 0.85$ independently of the kind of Z element. Also, the MR change rate becomes still higher in the range of $0.65 \leq x \leq 0.85$.

Next, since the magneto-resistance element in which Pb was replaced with Ir of the Heusler alloy was manufactured and since the above experiment was made on the manufactured magneto-resistance element, the result thereof is explained.

Figure 13A:
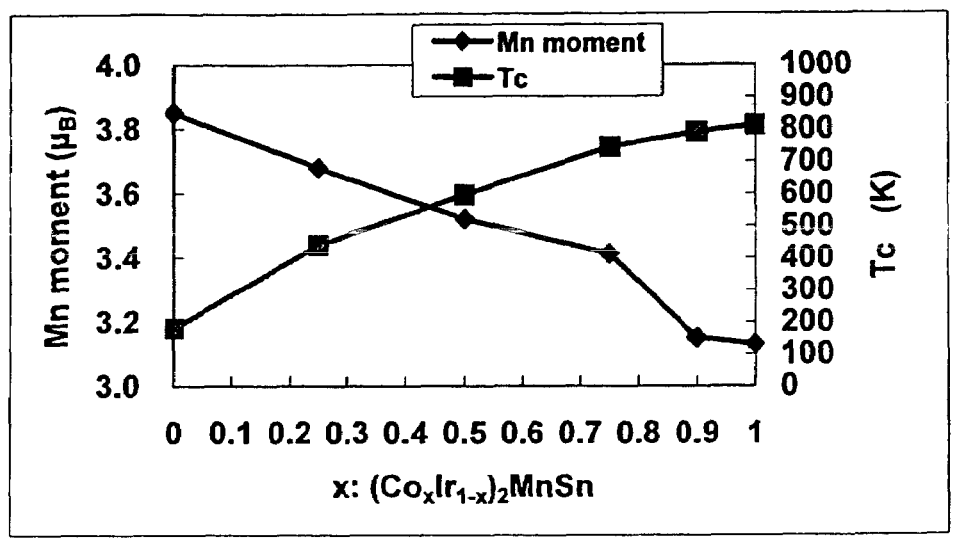
FIGS. 13A and 13B are graphs showing element characteristics when the composition of Co and Ir is varied in $(Co_xIr_{1-x})_2MnSn$.
Figure 13B:
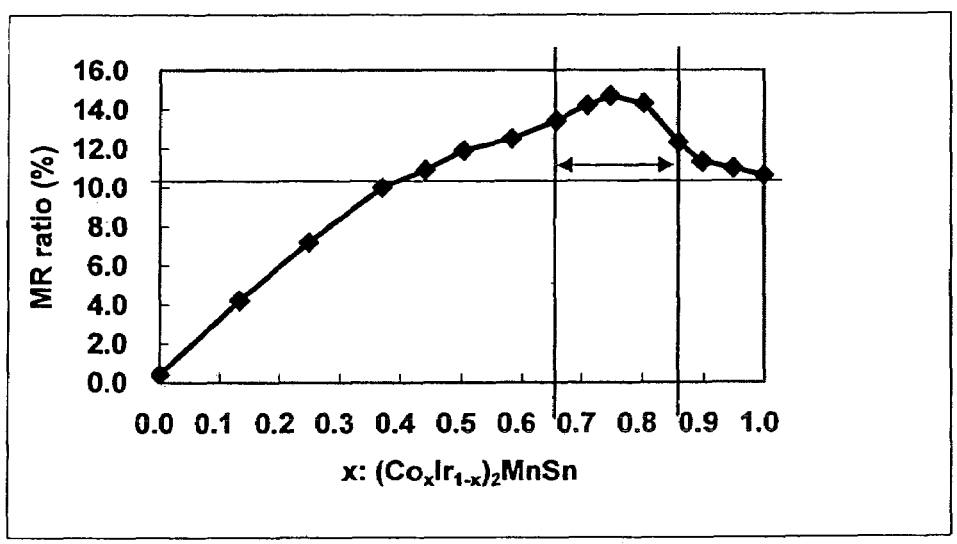

FIGS. 13A and 13B are graphs showing element characteristics when the composition of Co and Ir is varied in $(Co_xIr_{1-x})_2MnSn$. FIG. 13A is a graph showing changes of the Mn magnetic moment and the Curie temperature, and FIG. 13B is a graph showing the MR change rate at 300K. A straight line in FIG. 13B shows the MR change rate of 10.6% as the comparison example ($Co_2MnSn$). Incidentally, the MR change rate of $Ir_2MnSn$ was 0.4%.

As shown in FIG. 13B, a higher MR change rate than the change rate of 10.6% in the comparison example ($Co_2MnSn$) can be obtained in the range of $0.5 \leq x \leq 0.9$. Also, there are inflection points near X=0.66, 0.86 in the graph, the inclinations around the inflection points vary sharply, and therefore the MR change rate becomes higher in the range of $0.66 \leq x \leq 0.86$.

As shown by the results in FIGS. 13A to 13B, $(Co_xIr_{1-x})_2MnSn$ can obtain a higher MR change rate than $Co_2MnSn$ and $Pd_2MnSn$ in the range of $0.5 \leq x \leq 0.9$. Referring to the results in FIGS. 8A to 10B, it is expected that $(Co_xIr_{1-x})_2MnZ$ can obtain a higher MR change rate than $Co_2MnZ$ and $Pd_2MnZ$ in the range of $0.5 \leq x \leq 0.9$ independently of the kind of Z element. Also, the MR change rate becomes still higher in the range of $0.66 \leq x \leq 0.88$.

As described above, in a magnetic film of Heusler alloy that is represented by composition formula $X_2MnZ$ (where X is a precious metal element including Cu, and Z is an element from group III to group V, and hereinafter each meaning of X, Y, and Z is respectively similar to each of them mentioned), when an atomic composition ratio of Co in composition X is from 0.5 to 0.85, which are common in the graphs of the MR change rates in FIGS. 8A to 13B, a higher MR change rate can be obtained than $Co_2MnZ$ and $X_2MnZ$ in the range of $0.5 \leq x \leq 0.85$ independently of the kind of Z element. Also, when the atomic composition ratio of Co is from 0.68 to 0.85, a still higher MR change rate can be obtained. Incidentally, because of the property of Heusler alloy, there is no limitation on Mn, and the same effect can be obtained by a transition metal of V or Ti.

A magneto-resistance element according to the present invention, includes at least a pinned layer and a free layer including Heusler alloy represented by composition formula $X_2YZ$ (where Y is a transition metal of Mn, V, or Ti group), a part of composition X is replaced with Co, and an atomic composition ratio of Co in composition X is from 0.5 to 0.85. Accordingly, since the higher bulk diffusion effect and the higher Curie temperature can be attained simultaneously, the MR change rate becomes higher, heat radiation efficiency is improved and the higher heat-reliability can be obtained than the conventional art.

Further, the magneto-resistance element according to the present invention is applied to a thin-film magnetic head, reproduction performance is improved in a storage medium having narrower tracks than the conventional art and the heat reliability is enhanced.

Embodiment 2

The present embodiment provides a wafer that is used to manufacture the thin film magnetic head of Embodiment 1, a head gimbal assembly having a slider provided with the thin-film magnetic head, a head arm assembly provided with the head gimbal assembly, a head stack assembly provided with the head arm assembly, and a hard disk drive having a slider provided with the thin film magnetic head. Each arrangement is explained below.

Explanations are given of a wafer that is used to manufacture the thin film magnetic head according to Embodiment 1.

Figure 14:
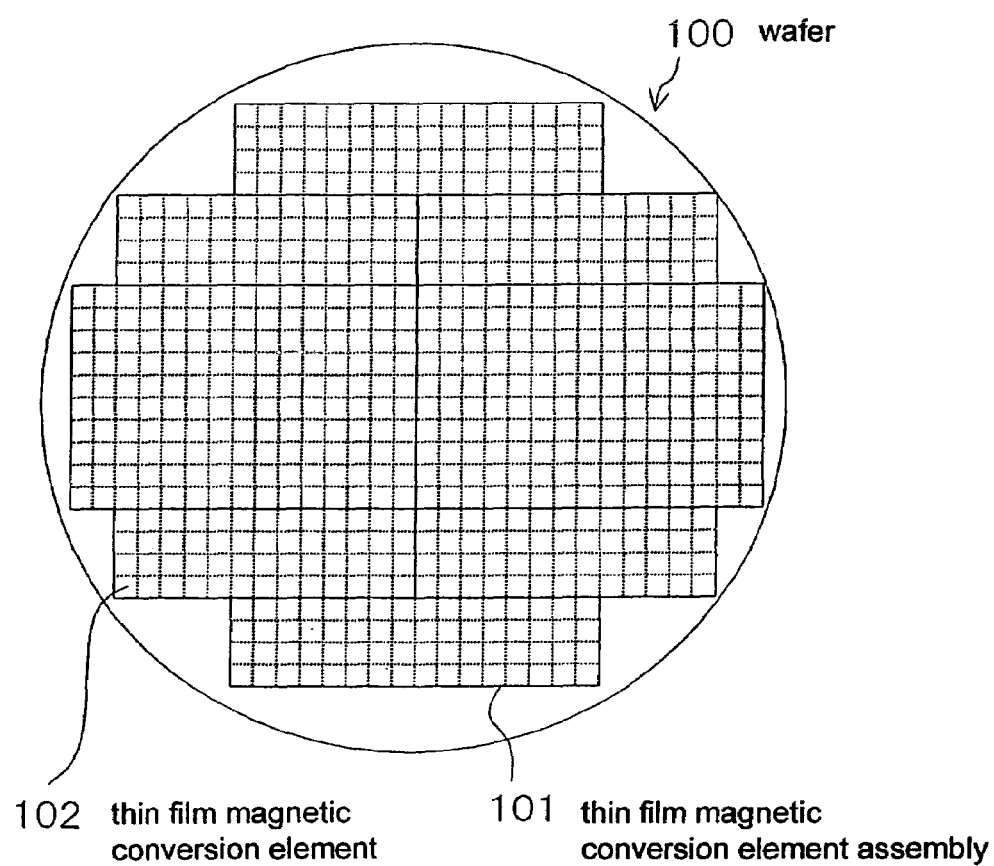
FIG. 14 is a plan view of a wafer used to manufacture a thin film magnetic head into which a magneto-resistance element according to the present invention is incorporated.

FIG. 14 is a conceptual plan view of a wafer. Wafer 100 is partitioned into a plurality of thin film magnetic conversion element assembly 101. Thin film magnetic conversion element assembly 101 includes thin film magnetic conversion element 102 formed by laminating the MR element of Embodiment 1 and inductive magnetic conversion element, and is a work unit for applying the polishing process to form ABS. Spacing (not shown) is provided between thin film magnetic conversion elements 102 and between thin film magnetic conversion elements 102.

Figure 15:
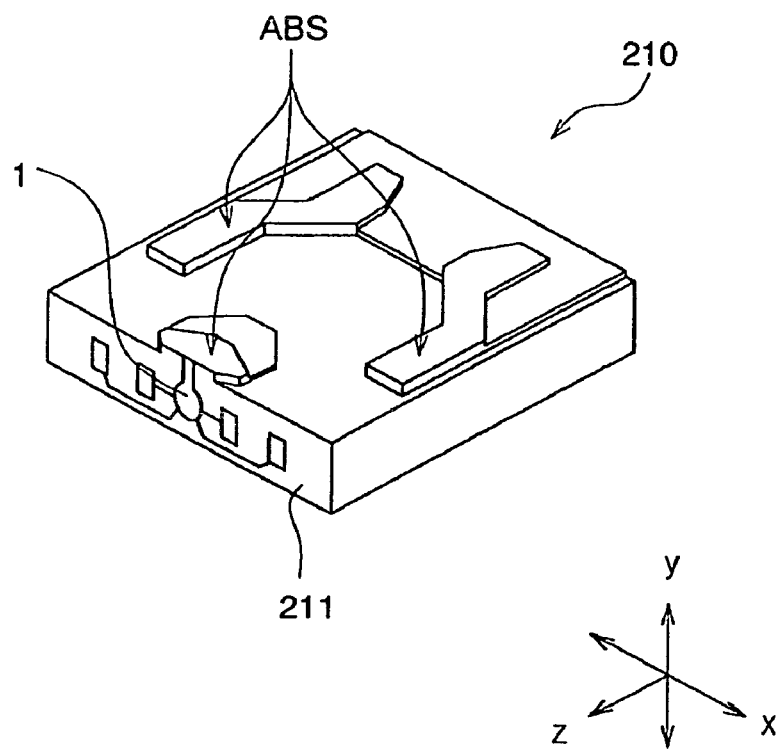
FIG. 15 is a perspective view illustrating a slider, which is included in a head gimbal assembly and which incorporates a magneto-resistance element according to the present invention.

Explanation next regards a head gimbal assembly and a hard disk drive that use the thin-film magnetic head. Referring to FIG. 15, slider 210, which is included in the head gimbal assembly, will be described first. In a hard disk drive, slider 210 is arranged opposite to a hard disk, which is a rotationally-driven disciform storage medium. Slider 210 has a substantially hexahedral form. One of the six surfaces of slider 210 forms ABS, which is positioned opposite to the hard disk. When the hard disk rotates in the z direction shown in FIG. 15, an airflow which passes between the hard disk and slider 210 creates a dynamic lift which is applied to slider 210 downward in the y direction of FIG. 15. Slider 210 is configured to lift up from the surface of the hard disk with this dynamic lift effect. In proximity to the trailing edge (the end portion at the lower left in FIG. 15) of slider 210, which is on the outlet side of the airflow, thin-film magnetic head 1 is formed.

Figure 16:
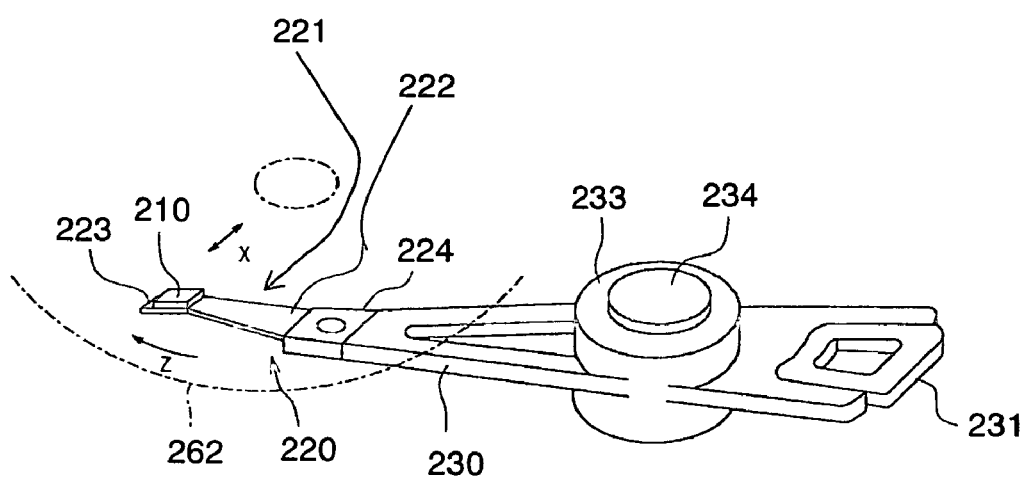
FIG. 16 is a perspective view illustrating a head arm assembly including the head gimbal assembly which incorporates a magneto-resistance element according to the present invention.

Referring to FIG. 16, head gimbal assembly 220 that has a thin-film magnetic head will be explained next. Head gimbal assembly 220 is provided with slider 210, and suspension 221 for elastically supporting slider 210. Suspension 221 has load beam 222 that is in the shape of a flat spring and is made of, for example, stainless steel. Suspension 221 also has flexure 223 that is attached to one end of load beam 222, and to which slider 210 is fixed, while providing an appropriate degree of freedom to slider 210. Suspension 221 further has base plate 224 that is provided on the other end of load beam 222. The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in the transverse direction x with regard to the track of hard disk 262. One end of arm 230 is attached to base plate 224. Coil 231, which constitutes a part of the voice coil motor, is attached to the other end of arm 230. In the intermediate portion of arm 230, bearing section 233 which has shaft 234 to rotatably hold arm 230 is provided. Arm 230 and the voice coil motor to drive arm 230 constitute an actuator.

Figure 17:
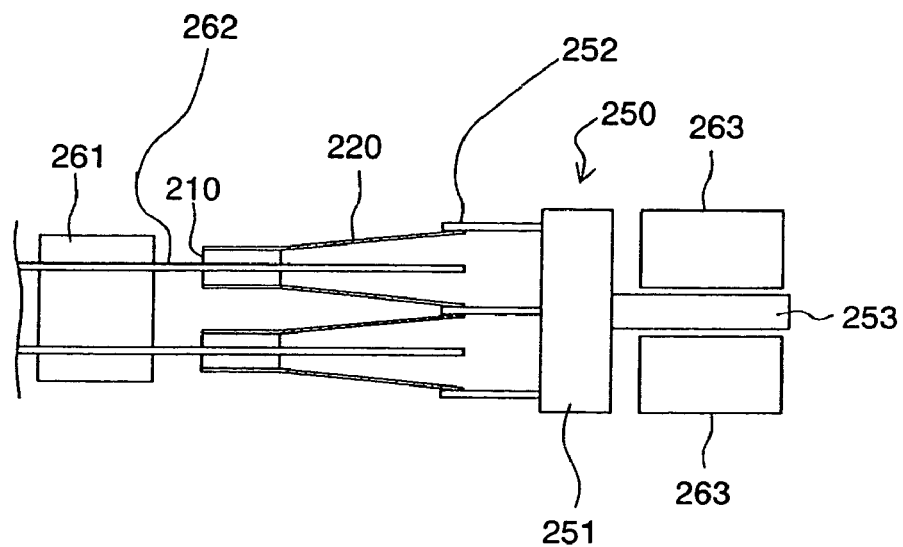
FIG. 17 is a schematic view illustrating the essential part of a hard disk drive which incorporates magneto-resistance elements according to the present invention.
Figure 18:
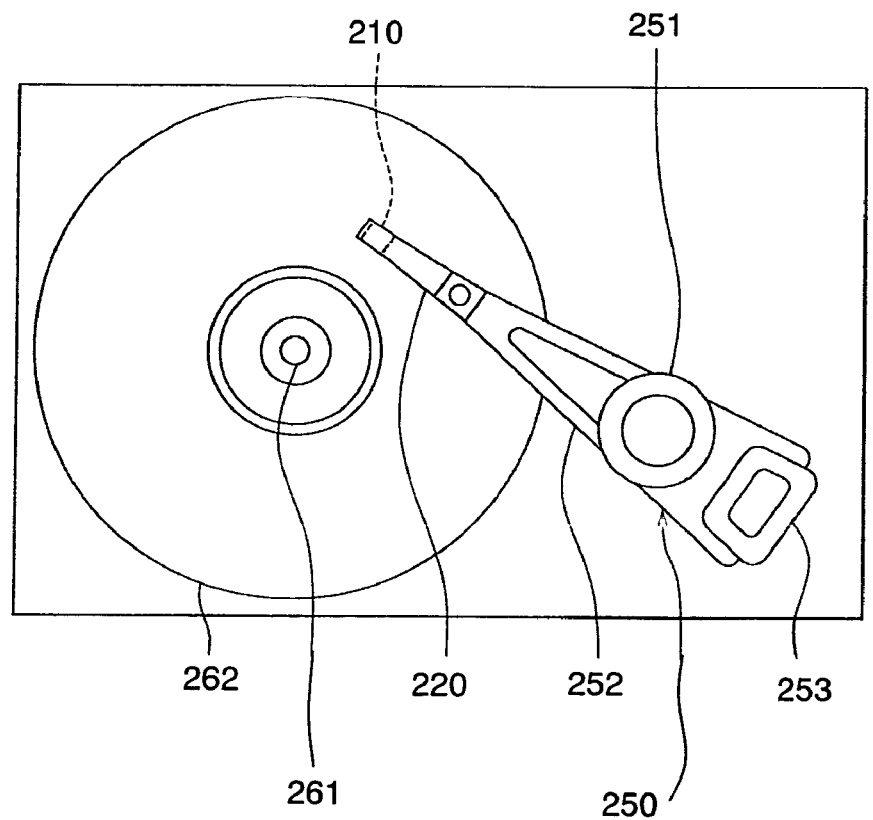
FIG. 18 is a plan view of a hard disk drive which incorporates magneto-resistance elements according to the present invention.

Referring to FIG. 17 and FIG. 18, a head stack assembly and a hard disk drive that use the thin-film magnetic head as a head element will be explained next. The arrangement in which head gimbal assemblies 220 are attached to the respective arms of a carriage having a plurality of arms is called a head stack assembly. FIG. 17 is an explanatory diagram illustrating an essential part of a hard disk drive, and FIG. 18 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side that is opposite to arms 252. The voice coil motor has permanent magnets 263 which are arranged in positions opposite to each other interposing coil 253 of head stack assembly 250 therebetween.

Referring to FIG. 18, head stack assembly 250 is installed in the hard disk drive. The hard disk drive has a plurality of hard disks which are connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 with a write head, and reads information recorded in hard disk 262 with a read head.

While preferred embodiments of the present invention have been described using specific terms, such description is for illustrative purposes only, and it is to be understood that changes and variations may be made without departing from the spirit or scope of the following claims.

What is claimed is:

1. A magneto-resistance element comprising:
   a pinned layer whose magnetization direction is fixed;
   a free layer whose magnetization direction varies in accordance with an external magnetic field; and
   a nonmagnetic spacer layer that is arranged between said pinned layer and said free layer:
   wherein at least said pinned layer or said free layer includes a layer having Heusler alloy represented by composition formula $X_2YZ$ (where X is a precious metal element, Y is a transition metal of Mn, V, or Ti group, Z is an element from group III to group V),
   a part of said composition X is replaced with Co, and an atomic composition ratio of Co in said composition X is from 0.5 to 0.85.

2. The magneto-resistance element according to claim 1, wherein said atomic composition ratio of Co is from 0.68 to 0.85.

3. A thin film magnetic head comprising the magneto-resistance element according to claim 1.

4. A magneto-resistance element comprising:
   a pinned layer whose magnetization direction is fixed;
   a free layer whose magnetization direction varies in accordance with an external magnetic field; and
   a nonmagnetic spacer layer that is arranged between said pinned layer and said free layer:
   wherein at least said pinned layer or said free layer includes a layer having Heusler alloy represented by composition formula $(Co_xPd_{1-x})_2YZ$ (where Y is a transition metal of Mn, V, or Ti group, and Z is an element from group III to group V), and
   $0.5 \leq x \leq 0.89$ is satisfied.

5. The magneto-resistance element according to claim 4, wherein $0.65 \leq x \leq 0.85$ is satisfied.

6. A magneto-resistance element comprising:
   a pinned layer whose magnetization direction is fixed;
   a free layer whose magnetization direction varies in accordance with an external magnetic field; and
   a nonmagnetic spacer layer that is arranged between said pinned layer and said free layer:
   wherein at least said pinned layer or said free layer includes a layer having Heusler alloy represented by composition formula $(Co_xRh_{1-x})_2YZ$ (where Y is a transition metal of Mn, V, or Ti group, and Z is an element from group III to group V), and
   $0.5 \leq x \leq 0.9$ is satisfied.

7. The magneto-resistance element according to claim 6, wherein $0.68 \leq x \leq 0.88$ is satisfied.

8. A magneto-resistance element comprising:
   a pinned layer whose magnetization direction is fixed;
   a free layer whose magnetization direction varies in accordance with an external magnetic field; and
   a nonmagnetic spacer layer that is arranged between said pinned layer and said free layer:
   wherein at least said pinned layer or said free layer includes a layer having Heusler alloy represented by composition formula $(Co_xRu_{1-x})_2YZ$ (where Y is a transition metal of Mn, V, or Ti group, and Z is an element from group iii to group V), and
   $0.5 \leq x \leq 0.85$ is satisfied.

9. The magneto-resistance element according to claim 8, wherein $0.65 \leq x \leq 0.85$ is satisfied.

10. A magneto-resistance element comprising:
    a pinned layer whose magnetization direction is fixed;
    a free layer whose magnetization direction varies in accordance with an external magnetic field; and
    a nonmagnetic spacer layer that is arranged between said pinned layer and said free layer:
    wherein at least said pinned layer or said free layer includes a layer having Heusler alloy represented by composition formula $(Co_xIr_{1-x})_2YZ$ (where Y is a transition metal of Mn, V, or Ti group, and Z is an element from group III to group V), and
    $0.5 \leq x \leq 0.9$ is satisfied.

11. The magneto-resistance element according to claim 10, wherein $0.66 \leq x \leq 0.86$ is satisfied.

\* \* \* \* \*